United States Patent
Ahn et al.

(10) Patent No.: US 9,882,120 B2
(45) Date of Patent: Jan. 30, 2018

(54) MAGNETIC MEMORY DEVICES INCLUDING IN-PLANE CURRENT LAYERS

(71) Applicant: Samsung Electronics Co., Ltd., Suwon-si, Gyeonggi-do (KR)

(72) Inventors: Sungmin Ahn, Suwon-Si (KR); Jisu Ryu, Hwaseong-Si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/956,766

(22) Filed: Dec. 2, 2015

(65) Prior Publication Data

US 2016/0181512 A1 Jun. 23, 2016

(30) Foreign Application Priority Data

Dec. 17, 2014 (KR) .................. 10-2014-0182449

(51) Int. Cl.
| | |
|---|---|
| *H01L 43/08* | (2006.01) |
| *G11C 11/16* | (2006.01) |
| *H01L 43/12* | (2006.01) |
| *H01L 27/22* | (2006.01) |

(52) U.S. Cl.
CPC ............ *H01L 43/08* (2013.01); *G11C 11/161* (2013.01); *H01L 27/228* (2013.01); *H01L 43/12* (2013.01)

(58) Field of Classification Search
CPC ......... H01L 43/08; H01L 43/02; H01L 43/10; H01L 43/12; H01L 27/222; H01L 27/228
See application file for complete search history.

(56) References Cited

U.S. PATENT DOCUMENTS

| 7,541,199 | B2 | 6/2009 | Bae et al. | |
|---|---|---|---|---|
| 8,203,193 | B2 | 6/2012 | Kajiyama et al. | |
| 8,729,647 | B2 | 5/2014 | Lee et al. | |
| 8,716,817 | B2 | 6/2014 | Saida et al. | |
| 2007/0297220 | A1 | 12/2007 | Yoshikawa et al. | |
| 2009/0218645 | A1* | 9/2009 | Ranjan ................... | G11C 11/16 257/421 |
| 2010/0096716 | A1* | 4/2010 | Ranjan ................... | B82Y 10/00 257/421 |
| 2010/0289098 | A1* | 11/2010 | Li .......................... | G11C 11/16 257/421 |
| 2011/0141796 | A1* | 6/2011 | Lee ........................ | H01L 43/10 365/158 |
| 2011/0233696 | A1* | 9/2011 | Li ......................... | G11C 11/5607 257/421 |
| 2011/0233969 | A1 | 9/2011 | Li | |
| 2012/0018825 | A1* | 1/2012 | Lim ....................... | H01L 43/08 257/421 |

(Continued)

FOREIGN PATENT DOCUMENTS

JP 2012043913 3/2012

*Primary Examiner* — Fazli Erdem
(74) *Attorney, Agent, or Firm* — Ward and Smith, P.A.

(57) ABSTRACT

A magnetic memory device can include an upper electrode, a lower electrode and a Magnetic Tunnel Junction (MTJ). The MTJ can include a reference magnetic pattern configured to generate a fixed magnetization and a free magnetic pattern on the reference magnetic pattern configured to generate a switchable magnetization that switches direction between parallel and anti-parallel to the fixed magnetization. A metal pattern can be on the free magnetic pattern and can be configured to conduct an in-plane current and a perpendicular-to-plane to/from the upper electrode.

7 Claims, 18 Drawing Sheets

(56) References Cited

U.S. PATENT DOCUMENTS

| | | | |
|---|---|---|---|
| 2012/0063218 A1* | 3/2012 | Huai | G11C 11/16 365/171 |
| 2012/0146167 A1* | 6/2012 | Huai | H01L 43/08 257/421 |
| 2012/0280339 A1 | 11/2012 | Zhang et al. | |
| 2013/0042081 A1* | 2/2013 | Park | H01L 43/08 711/154 |
| 2013/0258764 A1* | 10/2013 | Ranjan | G11C 11/16 365/158 |
| 2014/0056061 A1 | 2/2014 | Khvalkovskiy et al. | |
| 2015/0028440 A1* | 1/2015 | Liu | H01L 43/08 257/421 |
| 2015/0076485 A1* | 3/2015 | Sandhu | G11C 11/161 257/43 |
| 2015/0162525 A1* | 6/2015 | Park | H01L 43/08 257/421 |
| 2015/0188035 A1* | 7/2015 | Huai | G11C 11/16 257/421 |
| 2015/0295164 A1* | 10/2015 | Sandhu | H01L 43/08 257/421 |
| 2015/0357559 A1* | 12/2015 | Nagel | H01L 43/12 257/4 |
| 2016/0020250 A1* | 1/2016 | Li | H01L 27/224 365/158 |
| 2016/0133307 A1* | 5/2016 | Lee | H01L 43/08 257/421 |
| 2016/0197269 A1* | 7/2016 | Huai | G11C 11/16 257/421 |

\* cited by examiner

MAGNETIC MEMORY DEVICES INCLUDING IN-PLANE CURRENT LAYERS

CROSS-REFERENCE TO RELATED APPLICATIONS

This U.S. non-provisional patent application claims priority under 35 U.S.C. §119 to Korean Patent Application No. 10-2014-0182449, filed on Dec. 17, 2014, in the Korean Intellectual Property Office, the entire contents of which are hereby incorporated by reference.

FIELD

Example embodiments of the inventive concept relate to a magnetic memory device and a method of fabricating the same.

BACKGROUND

A magnetic memory device can provide technical advantages, such as low latency and non-volatility, and thus, is regarded as an emerging next-generation memory device.

The magnetic memory device may include a magnetic tunnel junction (MTJ). The MTJ may include two magnetic layers and a tunnel barrier layer therebetween. Resistance of the MTJ may vary depending on magnetization directions of the magnetic layers. For example, the resistance of the MTJ may be higher when magnetization directions of the magnetic layers are anti-parallel than when they are parallel. Such a difference in resistance can be used to store data in the magnetic memory device.

SUMMARY

Embodiments according to the invention can provide magnetic memory device including in-plane current layers and methods of forming the same. In some embodiments, a magnetic memory device can include a lower electrode, a magnetic tunnel junction on the lower electrode and a capping electrode on the magnetic tunnel junction. The magnetic tunnel junction can include a reference magnetic pattern having a fixed magnetization direction and a free magnetic pattern having a switchable magnetization direction. A tunnel barrier pattern can be between the reference magnetic pattern and the free magnetic pattern. A sub oxide pattern can be on the free magnetic pattern and a metal pattern can be between the sub oxide pattern and the free magnetic pattern, where the fixed and switchable magnetization directions can be substantially perpendicular to top surfaces of the reference and free magnetic patterns defining the magnetic tunnel junction.

In some embodiments, a magnetic memory device, can include a substrate, a lower electrode on the substrate, a magnetic tunnel junction on the lower electrode, and a capping electrode on the magnetic tunnel junction. The magnetic tunnel junction can include a reference magnetic pattern having a fixed magnetization direction, a free magnetic pattern having a switchable magnetization direction and a tunnel barrier pattern between the reference magnetic pattern and the free magnetic pattern, where the capping electrode can be asymmetrically centered at a position that is offset from a center of the magnetic tunnel junction.

In some embodiments, a magnetic memory device can include a magnetic tunnel junction and a capping electrode on the magnetic tunnel junction, wherein the magnetic tunnel junction can include a metal pattern adjacent to the capping electrode, and the capping electrode can be asymmetrically disposed at a position that is offset from a center of the magnetic tunnel junction defined by an axis passing through upper and lower surfaces of the magnetic tunnel junction.

In some embodiments, a method of fabricating a magnetic memory device, can include forming a lower electrode on a substrate. A magnetic tunnel junction can be formed on the lower electrode and a capping electrode can be formed on the magnetic tunnel junction, wherein the capping electrode can be formed by forming a first mask pattern on the magnetic tunnel junction, forming a second mask pattern in contact with a sidewall of the first mask pattern and covering the magnetic tunnel junction, patterning the magnetic tunnel junction using the first and second mask patterns as an etch mask, selectively removing the first mask pattern to form an opening exposing a sub oxide pattern of the magnetic tunnel junction, and forming the capping electrode in the opening.

In some embodiments, a magnetic memory device can include an upper electrode, a lower electrode and a Magnetic Tunnel Junction (MTJ). The MTJ can include a reference magnetic pattern configured to generate a fixed magnetization and a free magnetic pattern on the reference magnetic pattern configured to generate a switchable magnetization that switches direction between parallel and anti-parallel to the fixed magnetization. A metal pattern can be on the free magnetic pattern and can be configured to conduct an in-plane current and a perpendicular-to-plane to/from the upper electrode.

DETAILED DESCRIPTION

Figure 1:
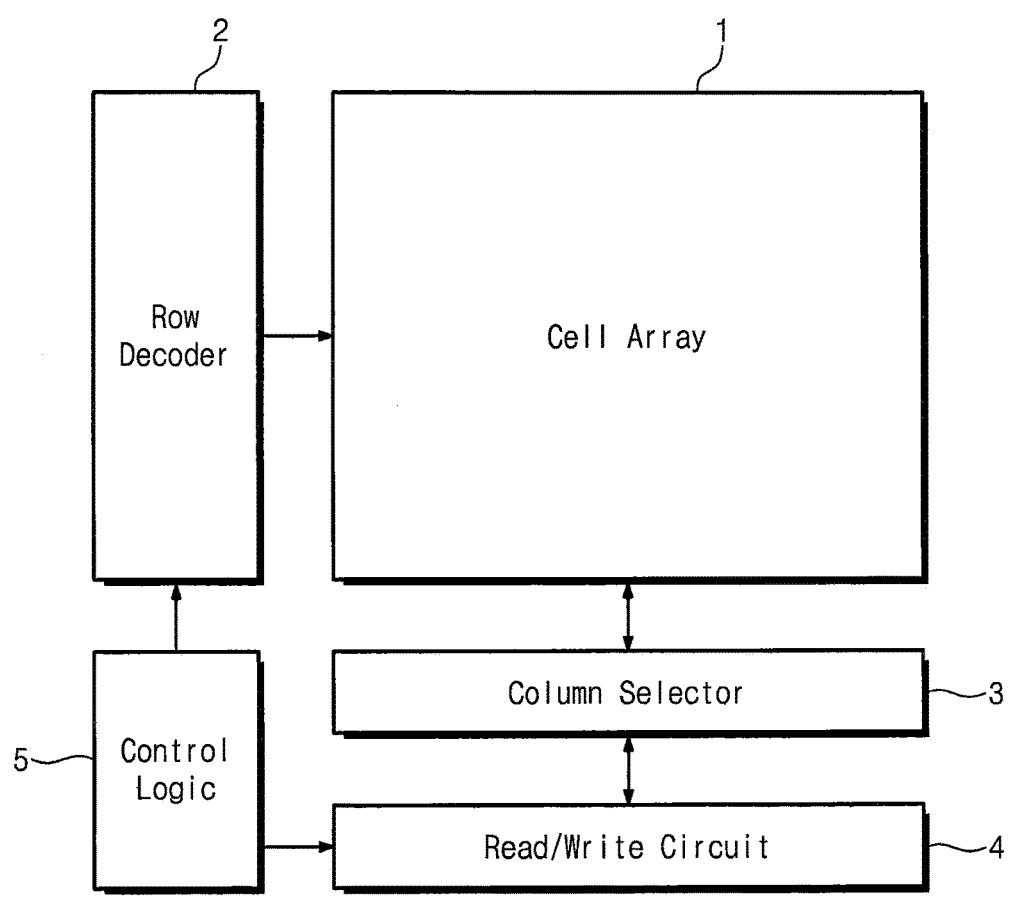
FIG. 1 is a block diagram of a magnetic memory device according to example embodiments of the inventive concept.

Example embodiments of the inventive concepts are described with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The inventive concept relates to controlling a current flow applied to a perpendicularly magnetized magnetic tunnel junction (pMTJ) of a MRAM device, to allow a reduction in a switching current density (Jc) used for switching the pMTJ. A perpendicular-to-plane current CPP and/or an in-plane current CIP may be used to operate the MRAM according to example embodiments of the inventive concept.

FIG. 1 is a block diagram of a magnetic memory device according to example embodiments of the inventive concept. Referring to FIG. 1, a magnetic memory device may include a memory cell array 1, a row decoder 2, a column selector 3, a read/write circuit 4, and a control logic 5.

The memory cell array 1 may include a plurality of word lines, a plurality of bit lines, and a plurality of memory cells, which are provided at respective intersections of the word and bit lines. Configuration of the memory cell array 1 is described in more detail with reference to FIG. 2.

The row decoder 2 may be connected to the memory cell array 1 through the word lines. The row decoder 2 may be configured to select at least one of the word lines, based on address information input from outside the memory cell array 1.

The column selector 3 may be connected to the memory cell array 1 through the bit lines to select at least one of the bit lines, based on address information input from outside the memory cell array 1. The at least one of the bit lines selected by the column selector 3 may be connected to the read/write circuit 4.

The read/write circuit 4 may provide a bit line bias, which will be used to access selected memory cells based on control from the control logic 5. For example, the read/write circuit 4 may provide a bit line voltage to a selected bit line and the bit line voltage may be used to read or write data from or to the selected ones of the memory cells, in response to the control logic 5.

The control logic 5 may output control signals for controlling the semiconductor memory device, based on command signals provided from outside the memory cell array 1. The read/write circuit 4 may be controlled by the control signals from the control logic 5.

Figure 2:
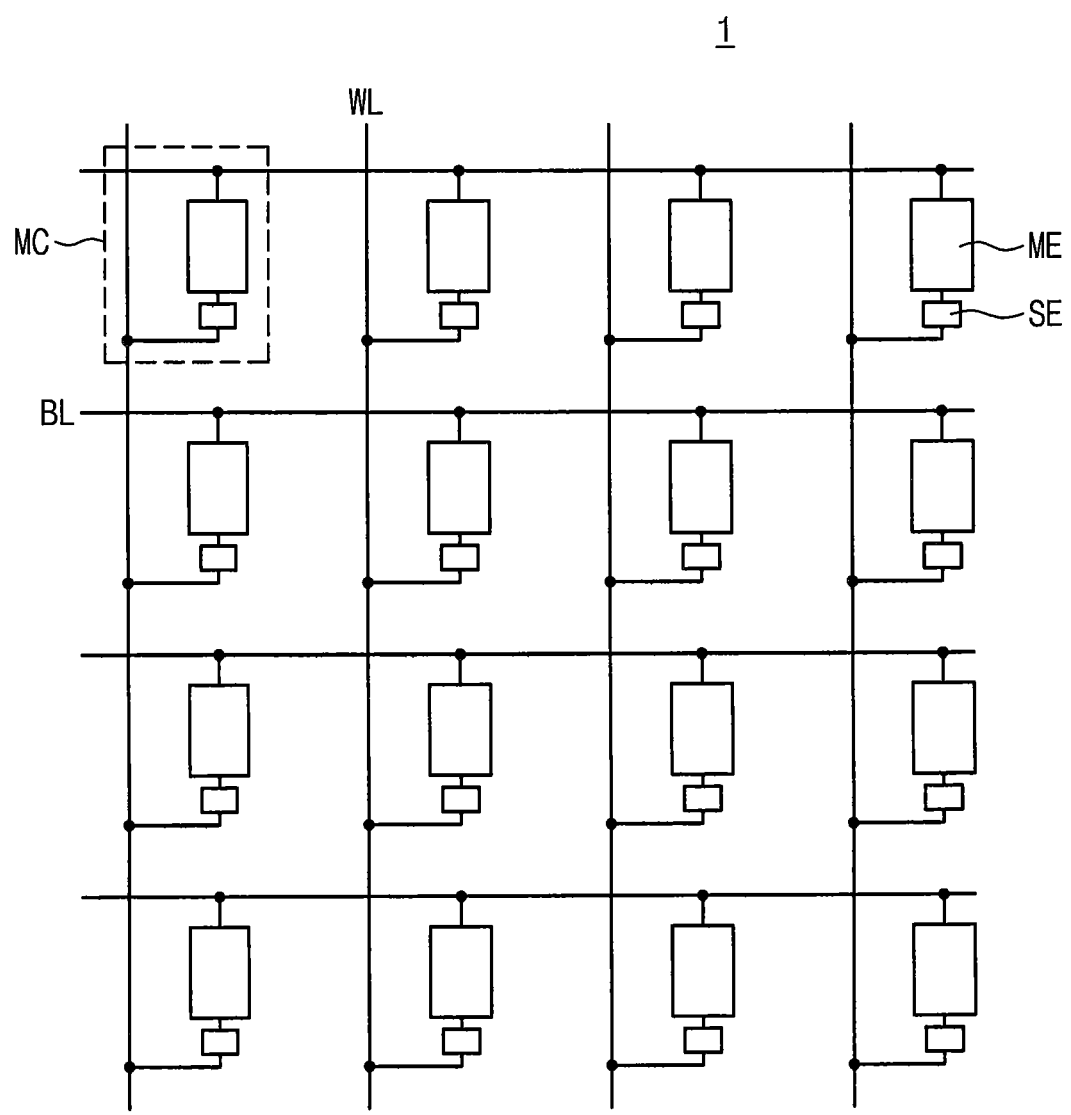
FIG. 2 is a circuit diagram of a memory cell array of a magnetic memory device according to example embodiments of the inventive concept.

FIG. 2 is a circuit diagram of the memory cell array 1 of a magnetic memory device according to exemplary embodiments of the inventive concept. Referring to FIG. 2, the memory cell array 1 may include a plurality of first conductive lines, a plurality of second conductive lines, and a plurality of unit memory cells MC. In example embodiments, the first conductive lines may serve as word lines WL, and the second conductive lines may serve as bit lines BL. The unit memory cells MC may be configured in two- or three-dimensions within the memory cell array 1. The word lines WL and the bit lines BL may cross each other and each of the unit memory cells MC may be provided at a corresponding one of intersections of the word lines WL and the bit lines BL. Each of the word lines WL may be connected to a plurality of the unit memory cells MC. Each of the bit lines BL may be connected to a corresponding one of the unit memory cells MC connected to each of the word lines WL. Here, the unit memory cells MC may be connected to the read/write circuit 4, described with reference to FIG. 1, through the bit lines BL.

Each of the unit memory cells MC may include a memory element ME and a selection element SE. The memory element ME may be provided between and connected to the bit line BL and the selection element SE, and the selection element SE may be provided between and connected to the memory element ME and the word line WL as illustrated in FIG. 2. The memory element ME may be a variable resistance device, wherein the resistance can be switched to one of at least two values, depending on an electric pulse applied thereto.

In example embodiments, the memory element ME may have a layered structure, wherein the resistance can by changed by a spin transfer process using a current passing therethrough. For example, the memory element ME may have a layered structure configured to exhibit a magneto-resistance property and may include at least one ferromagnetic material and/or at least one antiferromagnetic material. In example embodiments, the memory element ME may be a magnetic memory element with a magnetic tunnel junction MJT.

The selection element SE may be configured to selectively control a current passing through the memory element ME. For example, the selection element SE may be a p-channel metal-oxide-semiconductor field effect transistor (PMOS-FET). In the case that the selection element SE is a MOSFET, an additional interconnection line may be connected to the selection element SE.

Figure 3:
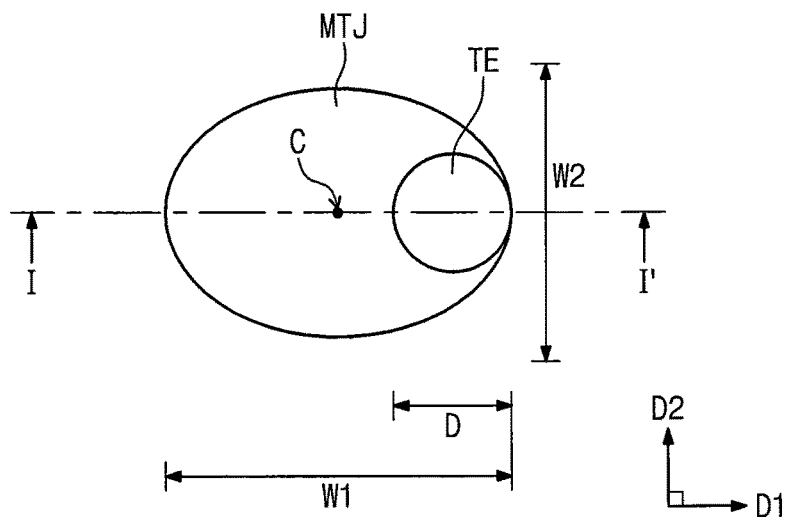
FIG. 3 is a plan view illustrating a memory element of a magnetic memory device according to example embodiments of the inventive concept.
Figure 4:
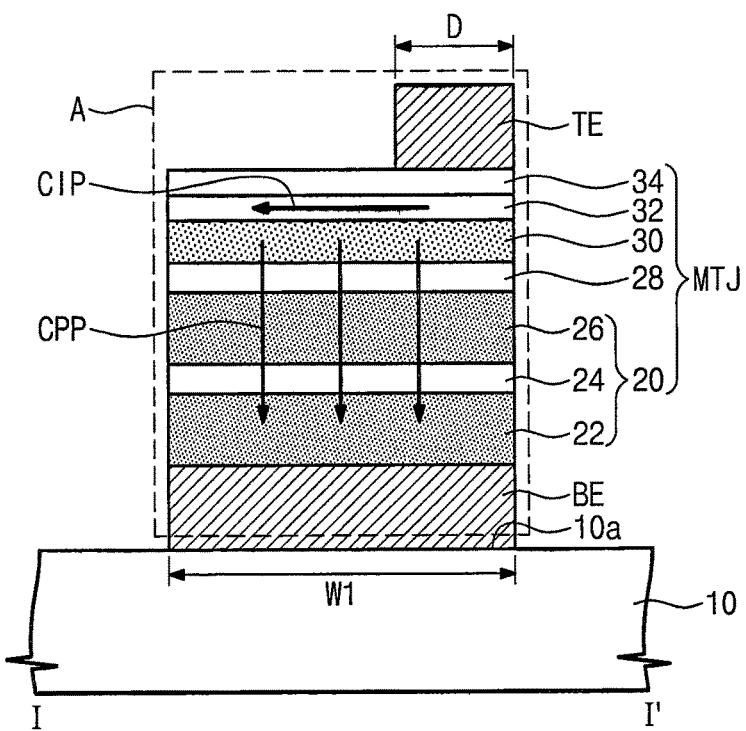
FIG. 4 is a sectional view taken along line I-I' of FIG. 3.

FIG. 3 is a plan view illustrating a memory element ME of a magnetic memory device according to example embodiments of the inventive concept. FIG. 4 is a sectional view taken along line I-I' of FIG. 3.

Referring to FIGS. 3 and 4, a lower electrode BE may be provided on a substrate 10. The substrate 10 may be a silicon substrate, germanium substrate, a silicon on insulator (SOI) substrate. and/or a silicon-germanium substrate. The substrate 10 may include an additional insulation layer thereon. The magnetic tunnel junction MTJ may be provided on the lower electrode BE. The magnetic tunnel junction MTJ may include a reference magnetic pattern 20, a tunnel barrier pattern 28, a free magnetic pattern 30, a heavy metal pattern 32, and a sub oxide pattern 34 which are sequentially stacked on the substrate 10. The reference magnetic pattern 20 may have a fixed magnetization direction, and the free magnetic pattern 30 may have a switchable magnetization direction.

The reference magnetic pattern 20 may include a first ferromagnetic pattern 22, an exchange coupling pattern 24, and a second ferromagnetic pattern 26, which are sequentially stacked on the substrate 10. The first ferromagnetic pattern 22 may have a magnetization direction that is anti-parallel to that of the second ferromagnetic pattern 26.

The magnetization directions of the first and second ferromagnetic patterns 22 and 26 may be substantially perpendicular to a top surface 10a of the substrate 10. In other words, the magnetization directions of the first and second ferromagnetic patterns 22 and 26 may be substantially perpendicular to a top surface of the reference magnetic pattern 20. The first and second ferromagnetic patterns 22 and 26 may include a perpendicular magnetic material (e.g., CoFeTb, CoFeGd, and/or CoFeDy), a perpendicular magnetic material having a $L1_0$ structure, or CoPt having a hexagonal close packed (HCP) lattice structure. Here, the perpendicular magnetic materials with $L1_0$ structure may include at least one of $L1_0$FePt, $L1_0$FePd, $L1_0$CoPd, or $L1_0$CoPt. The exchange coupling pattern 24 may include at least one of non-magnetic metals including non-magnetic transition metals. For example, the exchange coupling pattern 24 may include at least one selected from the group consisting of magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobium (Nb), zirconium (Zr), yttrium (Y), and hafnium (Hf).

The lower electrode BE may include at least one of conductive metal nitrides and metals. In example embodiments, the lower electrode BE may serve as a seed layer in a process of forming the reference magnetic pattern 20. For example, in the case where the reference magnetic pattern 20 is formed of at least one of the perpendicular magnetic materials with L10 structure, the lower electrode BE may include at least one of conductive metal nitrides having the NaCl crystal structure (e.g., titanium nitride, tantalum nitride, chromium nitride, or vanadium nitride). Alternatively, the reference magnetic pattern 20 can have a HCP lattice structure, and the lower electrode BE may include at least one conductive material, such as ruthenium, having the HCP lattice structure. However, example embodiments of the inventive concepts may not be limited thereto. For example, the lower electrode BE may include at least another conductive material (e.g., titanium or tantalum).

The tunnel barrier pattern 28 may include at least one of magnesium oxide, titanium oxide, aluminum oxide, magnesium-zinc oxide, or magnesium-boron oxide. In example embodiments, the tunnel barrier pattern 28 may include magnesium oxide having the NaCl crystal structure.

The free magnetic pattern 30 may have a magnetization direction that is substantially perpendicular to the top surface 10a of the substrate 10. In other words, the magnetization direction of the free magnetic pattern 30 may be substantially perpendicular to the top surface of the free magnetic pattern 30. The free magnetic pattern 30 may include a perpendicular magnetic material (e.g., CoFeTb, CoFeGd, and/or CoFeDy), a perpendicular magnetic material having a $L1_0$ structure, or CoPt having a hexagonal close packed (HCP) lattice structure. Here, the perpendicular magnetic materials with $L1_0$ structure may include at least one of $L1_0$FePt, $L1_0$FePd, $L1_0$CoPd, or $L1_0$CoPt.

The sub oxide pattern 34 may include at least one of magnesium oxide, titanium oxide, aluminum oxide, magnesium-zinc oxide, or magnesium-boron oxide. The sub oxide pattern 34 may be configured to allow the free magnetic pattern 30 to have a magnetization direction perpendicular to the top surface 10a of the substrate 10. The sub oxide pattern 34 may be thin enough to allow an electric current to pass therethrough. For example, the sub oxide pattern 34 may have a thickness ranging from 0.5 Å to 30 Å.

The heavy metal pattern 32 may include a material, whose atomic number is higher than or equal to 30. The heavy metal pattern 32 may include at least one of transition metals or rare-earth metals. The heavy metal pattern 32 may include at least one of, for example, Ta, Pt, or Hf. A thickness of the heavy metal pattern 32 may be less than two times that of the free magnetic pattern 30 thickness. As an example, the heavy metal pattern 32 may have a thickness ranging from 0.5 nm to 2 nm. Preferably, the heavy metal pattern 32 may have a thickness of about 1 nm.

A capping electrode TE may be provided on the magnetic tunnel junction MTJ. The capping electrode TE may include at least one of, for example, Ru, Ta, Ti, or Pt. The capping electrode TE may further include a conductive metal nitride layer. The capping electrode TE may be shaped like a circle whose diameter is D. Alternatively, the capping electrode TE may be shaped like a square whose length of each side is D. Other shapes may also be used.

According to example embodiments of the inventive concept, the capping electrode TE may be asymmetrically disposed at a position that is offset from the center C of the magnetic tunnel junction MTJ, and this asymmetric disposition of the capping electrode TE may allow a perpendicular-to-plane current CPP and an in-plane current CIP to pass through (or develop in) the magnetic tunnel junction MTJ. The in-plane current CIP may flow mainly through the free magnetic pattern 30 and the heavy metal pattern 32.

In the case of the conventional pMTJ, a magnetization direction of the free magnetic pattern 30 is switched by only the perpendicular-to-plane current CPP flowing in a direction normal to the top surface of the free magnetic pattern 30, and thus, the switching of the magnetization direction of the free magnetic pattern 30 is accomplished by a spin-transfer torque (STT) phenomenon. However, due to very low efficiency in STT (approximately, 10-50 Oe per MA/cm$^2$), a very high current density (e.g., of about 50-10$^2$ MA/cm$^2$) may be required to perform a write operation on the conventional pMTJ.

By contrast, according to example embodiments of the inventive concept, the magnetic tunnel junction MTJ may be configured to include the heavy metal pattern 32 disposed adjacent to the free magnetic pattern 30, and this allows a spin-orbit interaction (SOI) to be included in a write operation on a pMTJ. Accordingly, the heavy metal pattern 32 of the pMTJ can be applied with not only the perpendicular-to-plane current CPP but also the in-plane current CIP. For example, when the perpendicular-to-plane current CPP of 2.72 MA/cm$^2$ was applied to the free magnetic pattern 30, the in-plane current CIP was of about 10-20 MA/cm$^2$.

Figure 5:
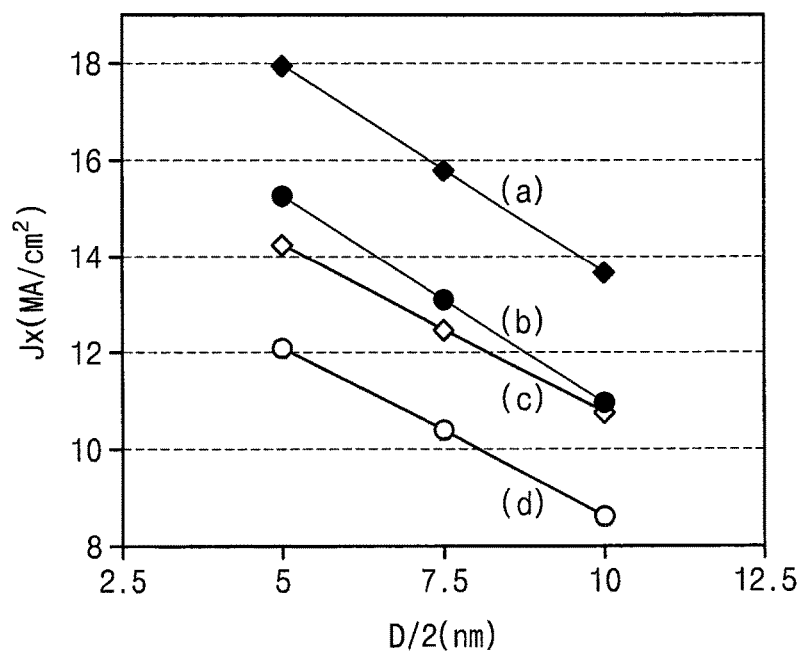
FIG. 5 is a graph showing results of simulation of in-plane currents passing through memory elements, to which the inventive concept is applied.

FIG. 5 shows results of simulation on the in-plane currents CIP passing through memory elements, given by different diameters D of an offset capping electrode TE. Here, the capping pattern TE was circular, and the magnetic tunnel junction MTJ had an elliptical shape having a first width W1 and a second width W2 in directions of major and minor axes, respectively. The first width W1 and the second width W2 were respectively changed between 45.6 nm and 52 nm and between 45.6 nm and 40 nm and the thickness t of the heavy metal pattern 32 was changed between 1 nm and 2 nm. In detail, the curves (a), (b), (c), and (d) of FIG. 5 were obtained from the samples with the following dimensions: (a) W1=52 nm, W2=40 nm, t=1 nm, (b) W1=52 nm, W2=40 nm, t=2 nm, (c) W1=45.6 nm, W2=45.6 nm, t=1 nm, and (d) W1=45.6 nm, W2=45.6 nm, t=2 nm. The smaller the capping pattern TE the higher the in-plane current CIP. Also, the in-plane current CIP was greater when the magnetic tunnel junction MTJ had an elliptical shape than when it had a circular shape. Accordingly, in some embodiments the more that the edge of the capping pattern TE is offset from a center of the MTJ, the greater the in-plane current CIP.

Figure 6A:
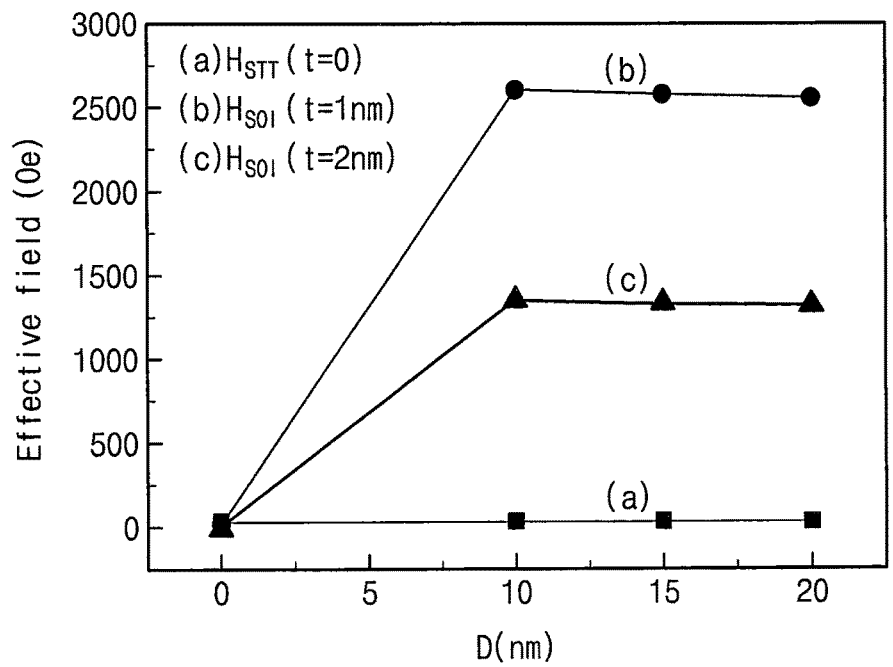
FIGS. 6A and 6B are graphs showing results of calculation of effective magnetic fields and current densities in memory elements, to which the inventive concept is applied.
Figure 6B:
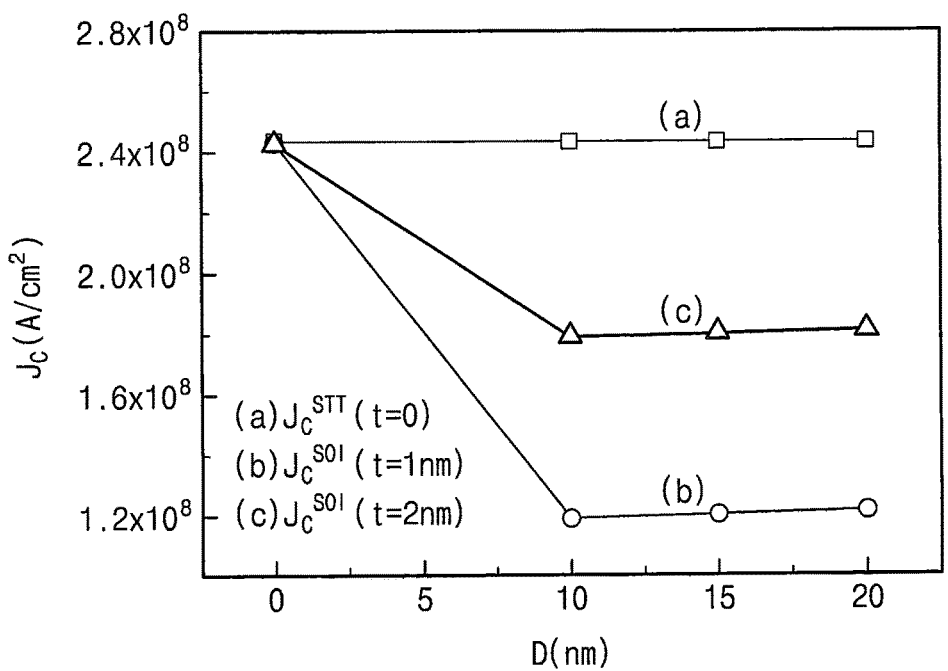

FIGS. 6A and 6B are graphs showing results of calculation of effective magnetic fields and current densities in memory elements, to which the inventive concept is applied. In detail, the effective magnetic fields and current densities of FIGS. 6A and 6B were obtained from the in-plane currents CIP of FIG. 5, using a Landau-Lifshitz-Gilbert (LLG) equation, in which a Rashba effect (RH), a spin Hall effect (SHE), and Dzyaloshinskii-Moriya interaction (DMI) caused by a spin-orbit interaction (SOI) are considered, when the perpendicular-to-plane current CPP of 2.72 MA/cm2 was applied to the free magnetic pattern 30. In the case that the heavy metal pattern 32 contains an element having a high atomic number (e.g., of about 30 or higher), the Rashba effect (RH), spin Hall effect (SHE), and Dzyaloshinskii-Moriya interaction (DMI) may be more effective.

In the conventional pMTJ (i.e., of D=0 and t=0), only the perpendicular-to-plane current CPP is applied to the free magnetic pattern 30, and thus, an effective magnetic field $H_{STT}$ generated by the spin transfer torque STT was about 30 Oe. As a result, there was no substantial decrease in the current density Jc (i.e., of about 2.4 MA/cm$^2$), as depicted by the curve (a) of FIG. 6B. By contrast, in example embodiments of the inventive concept, due to the asymmetric disposition of the capping pattern TE (i.e., D>10 nm with t>0), it is possible to additionally apply the in-plane current CIP to the free magnetic pattern 30, and thus, the effective magnetic field $H_{SOI}$ resulting from the spin-orbit interaction (SOI) was about 1.5-2.5 kOe. As a result, the current density Jc was reduced to about 1.2 MA/cm$^2$ to about 1.8 MA/cm$^2$, as depicted by the curves (b) and (c) of FIG. 6B respectively.

FIGS. 7A through 7E are sectional views taken along a direction corresponding to the line I-I' of FIG. 3 to illustrate a method of forming a memory element ME of a magnetic memory device according to example embodiments of the inventive concept.

Figure 7A:
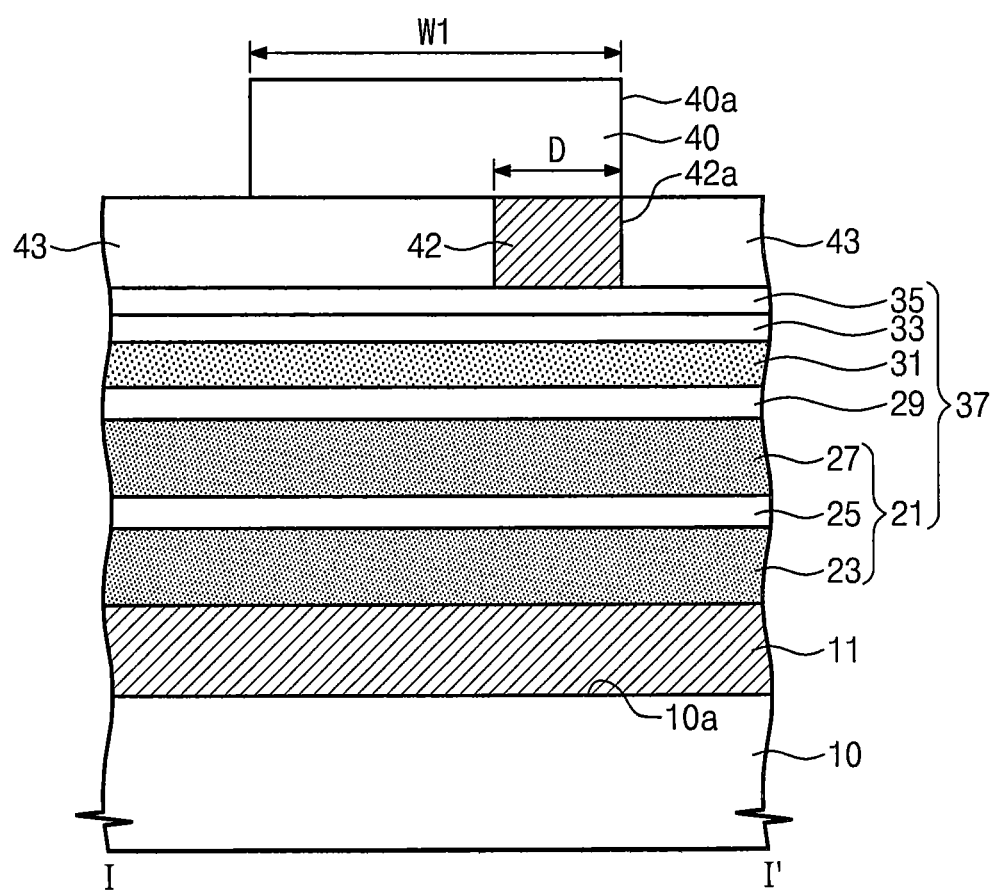
FIGS. 7A through 7E are sectional views taken along a direction corresponding to the line I-I' of FIG. 3 to illustrate a method of forming a memory element of a magnetic memory device according to example embodiments of the inventive concept.

Referring to FIGS. 3 and 7A, a lower electrode layer 11 may be formed on the substrate 10. The lower electrode layer 11 may include at least one of conductive metal nitrides or metals. In example embodiments, the lower electrode layer 11 may serve as a seed layer in a subsequent process of forming a reference magnetic layer 21. For example, lower electrode layer 11 may include at least one of conductive metal nitrides having the NaCl crystal structure (e.g., titanium nitride, tantalum nitride, chromium nitride, or vanadium nitride). Alternatively, the lower electrode layer 11 may include at least one of conductive materials, such as ruthenium, having the HCP lattice structure. However, example embodiments of the inventive concepts may not be limited thereto. The lower electrode layer 11 may include at least one of other conductive materials (e.g., titanium or tantalum).

A magnetic tunnel junction layer 37 may be formed on the lower electrode layer 11. The magnetic tunnel junction layer 37 may include the reference magnetic layer 21, a tunnel barrier layer 29, a free magnetic layer 31, a heavy metal layer 33, and a sub oxide layer 35, which are sequentially stacked on the substrate 10.

First, the reference magnetic layer 21 may be formed on the lower electrode layer 11. The reference magnetic layer 21 may include a first ferromagnetic layer 23, an exchange coupling layer 25, and a second ferromagnetic layer 27 stacked sequentially. The first ferromagnetic layer 23 may have a magnetization direction that is substantially antiparallel to that of the second ferromagnetic layer 27. The first and second ferromagnetic layers 23 and 27 may include ferromagnetic materials and have magnetization directions which are substantially perpendicular to the top surface 10a of the substrate 10. In other words, the magnetization directions of the first and second ferromagnetic layers 23 and 27 may be substantially perpendicular to the top surfaces thereof. The first ferromagnetic layer 23 and the second ferromagnetic layer 27 may include a perpendicular magnetic material (e.g., CoFeTb, CoFeGd, and/or CoFeDy), a perpendicular magnetic material having a $L1_0$ structure, or CoPt having a hexagonal close packed (HCP) lattice structure. Here, the perpendicular magnetic materials with $L1_0$ structure may include at least one of $L1_0$FePt, $L1_0$FePd, $L1_0$CoPd, or $L1_0$CoPt. The exchange coupling pattern 25 may include at least one of non-magnetic metals including non-magnetic transition metals. For example, the exchange coupling pattern 25 may include at least one selected from the group consisting of magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobium (Nb), zirconium (Zr), yttrium (Y), and hafnium (Hf).

The tunnel barrier layer 29 may be formed on the reference magnetic layer 21. The tunnel barrier layer 29 may include at least one of magnesium oxide, titanium oxide, aluminum oxide, magnesium-zinc oxide, or magnesium-boron oxide. In example embodiments, the tunnel barrier layer 29 may include magnesium oxide having the NaCl crystal structure.

The free magnetic layer 31 may be formed on the tunnel barrier layer 29. The free magnetic layer 31 may have a magnetization direction which is substantially perpendicular to the top surface 10a of the substrate 10. In other words, the magnetization direction of the free magnetic layer 31 may be substantially perpendicular to a top surface thereof. The free magnetic layer 31 may include a perpendicular magnetic material (e.g., CoFeTb, CoFeGd, and/or CoFeDy), a perpendicular magnetic material having a $L1_0$ structure, or CoPt having a hexagonal close packed (HCP) lattice structure. Here, the perpendicular magnetic materials with $L1_0$ structure may include at least one of $L1_0$FePt, $L1_0$FePd, $L1_0$CoPd, or $L1_0$CoPt.

The heavy metal layer 33 may be formed on the free magnetic layer 31. The heavy metal layer 33 may include at least one of transition metals or rare-earth metals. For example, the heavy metal layer 33 may include at least one of Ta, Pt, or Hf. The heavy metal layer 33 may have a thickness ranging from 0.5 Å to 20 Å.

The sub oxide layer 35 may be formed on the heavy metal layer 33. The sub oxide layer 35 may include at least one of magnesium oxide, titanium oxide, aluminum oxide, magnesium-zinc oxide, or magnesium-boron oxide. The sub oxide layer 35 may be thin enough to allow an electric current to pass therethrough. For example, the sub oxide layer 35 may have a thickness ranging from 0.5 Å to 30 Å.

A first mask pattern 42 may be formed on the magnetic tunnel junction layer 37. The first mask pattern 42 may be formed to expose a portion of a top surface of the magnetic tunnel junction layer 37. The first mask pattern 42 may be formed of or include, for example, a silicon nitride layer or a silicon oxynitride layer. When viewed in a plan view, the first mask pattern 42 may have a width of D. As an example, as shown in FIG. 3, the first mask pattern 42 may be shaped like a circle whose diameter is D. Alternatively, the first mask pattern 42 may be shaped like a square whose length of each side is D. Other shapes may also be used.

A second mask layer 43 may be formed to cover the magnetic tunnel junction layer 37. The second mask layer 43 may be provided to enclose the first mask pattern 42, thereby being in contact with sidewalls of the first mask pattern 42. The second mask layer 43 may be formed of or include a material having an etch selectivity with respect to the first mask pattern 42. For example, the second mask layer 43 may include a silicon oxide layer.

A third mask pattern 40 may be provided on the first mask pattern 42 and the second mask layer 43. The third mask pattern 40 may be formed of or include a material having an etch selectivity with respect to the second mask layer 43. For example, the third mask pattern 40 may include a titanium nitride layer. Alternatively, the third mask pattern 40 may include a silicon nitride layer or a silicon oxynitride layer. The third mask pattern 40 may be provided over substantially the entire top surface of the first mask pattern 42. A sidewall 40a of the third mask pattern 40 may be aligned to a sidewall 42a of the first mask pattern 42. Alternatively, when viewed in a plan view, the sidewall 40a of the third mask pattern 40 may be positioned adjacent to the sidewall 42a of the first mask pattern 42.

Figure 7B:
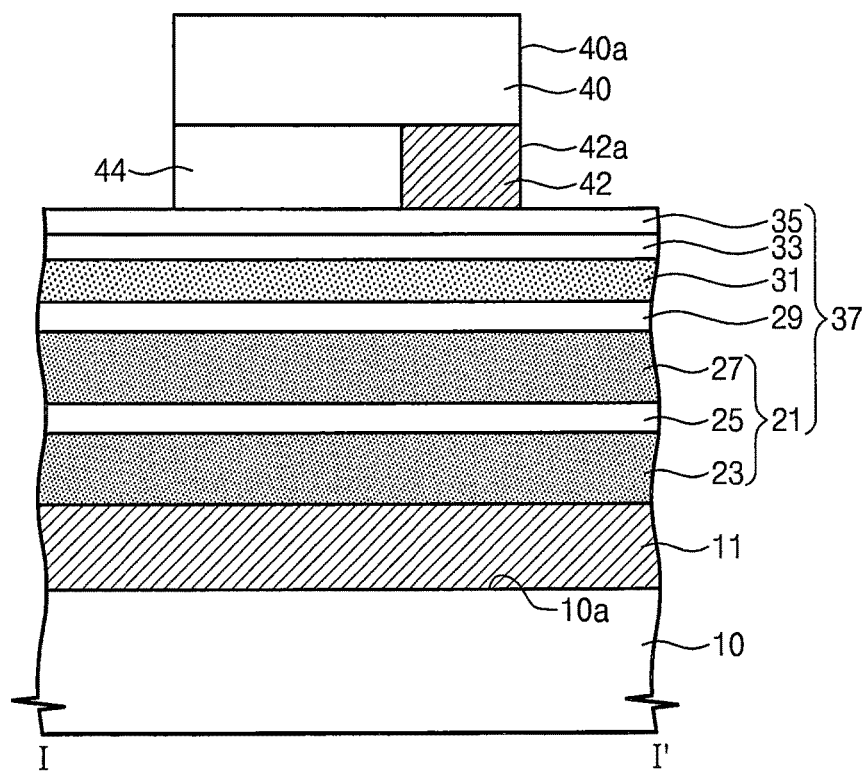

Referring to FIGS. 3 and 7B, the first mask pattern 42 and the second mask layer 43 may be etched using the third mask pattern 40 as an etch mask. As a result, a second mask pattern 44 may be formed. The second mask pattern 44 may expose the sidewall 42a of the first mask pattern 42 and may be in contact with other sidewall of the first mask pattern 42. In other words, the first mask pattern 42 may be provided at an edge of the second mask pattern 44, when viewed in a first direction D1 parallel to the top surface 10a of the substrate 10. The second and third mask patterns 44 and 40 may be shaped like an ellipse having a first width W1 in the first direction D1 and a second width W2 in a second direction D2, which is parallel to the top surface 10a or perpendicular to the first direction D1. Here, the first width W1 may be greater than the second width W2, as show in FIG. 3. Alternatively, each of the second and third mask patterns 44 and 40 may be shaped like a rectangle, whose two adjacent sides have lengths of W1 and W2, respectively. The second and third mask patterns may have other shapes. The sidewall 40a of the third mask pattern 40 may be aligned to the sidewall 42a of the first mask pattern 42. The first mask pattern 42 may have a width D that is less than the second width W2 of the second and third mask patterns 44 and 40.

Figure 7C:
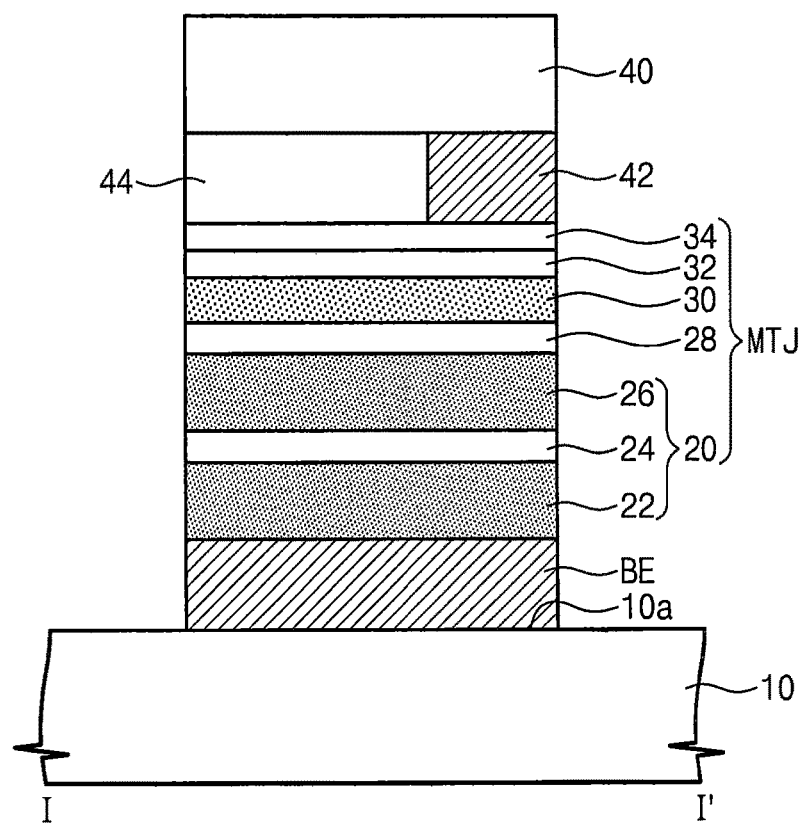

Referring to FIG. 7C, the magnetic tunnel junction layer 37 may be etched using the third mask pattern 40 as an etch mask to form the magnetic tunnel junction MTJ. Here, the first mask pattern 42 and the second mask pattern 44 may also be used as the etch mask to etch the magnetic tunnel junction layer 37. The magnetic tunnel junction MTJ may be formed to have the same structure as that previously described with reference to FIG. 4. In addition, the lower electrode layer 11 may be etched using the third mask pattern 40 as an etch mask to form the lower electrode BE.

Figure 7D:
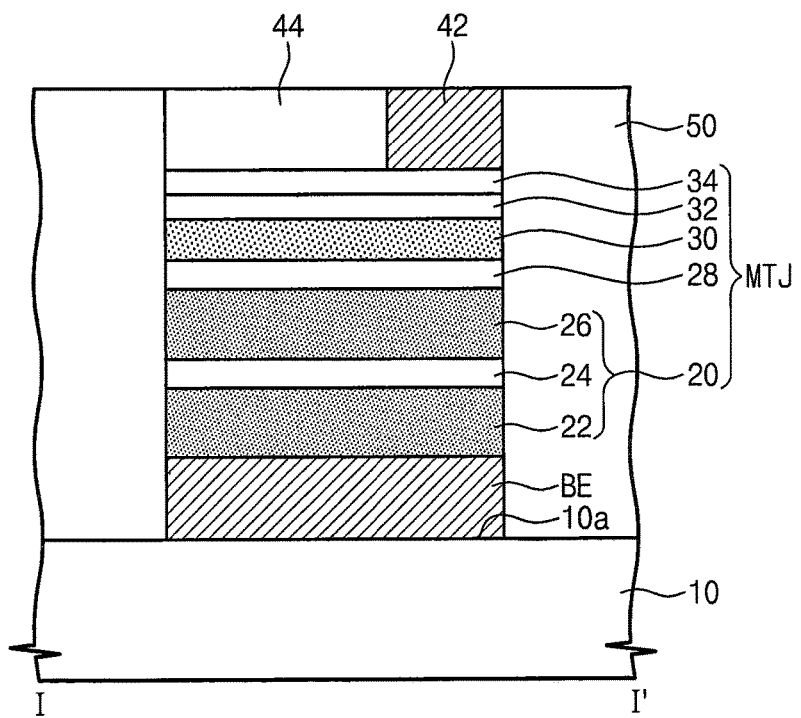

Referring to FIG. 7D, the third mask pattern 40 may be selectively removed. An interlayered insulating layer 50 may be formed to be in contact with sidewalls of the magnetic tunnel junction MTJ, the first mask pattern 42, and the second mask pattern 44. The interlayered insulating layer 50 may include a silicon oxide layer. The interlayered insulating layer 50 may be formed to expose an upper surface of the first mask pattern 42.

Figure 7E:
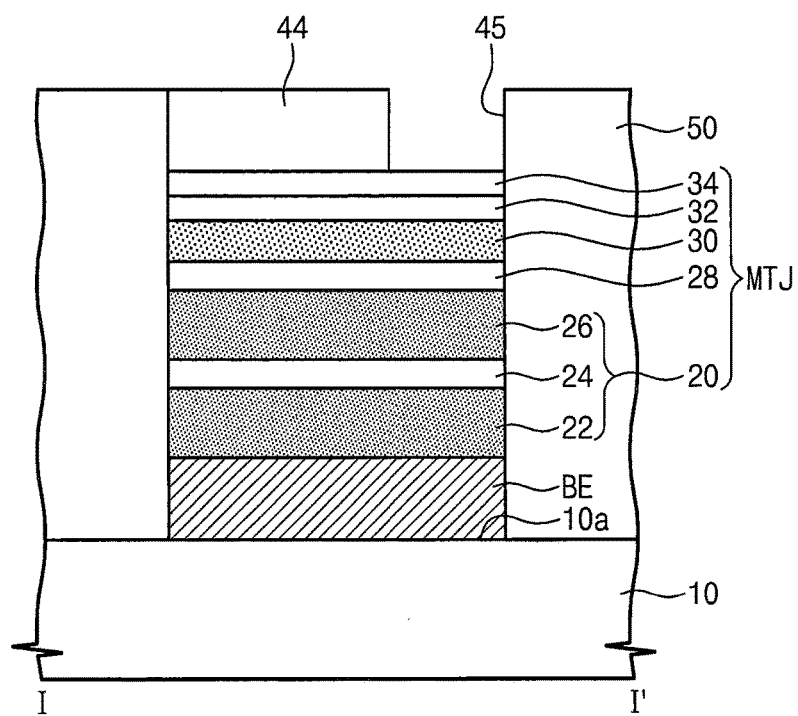

Referring to FIG. 7E, the first mask pattern 42 may be selectively etched to form an opening 45 exposing the top surface of the magnetic tunnel junction MTJ. In the case where the first mask pattern 42 includes a silicon nitride layer, etching solution containing phosphoric acid may be used to selectively etch the first mask pattern 42.

Referring to FIGS. 4 and 7E, the capping electrode TE may be formed in the opening 45. The capping electrode TE may be formed by depositing a capping electrode layer and planarizing the capping electrode layer to expose the interlayered insulating layer 50 and the second mask pattern 44. The capping electrode layer may include at least one of, for example, Ru, Ta, Ti, or Pt. The capping electrode layer may further include a conductive metal nitride layer. In order to reduce complexity in the drawings, the interlayered insulating layer 50 and the second mask pattern 44 are omitted from FIG. 4.

Figure 8:
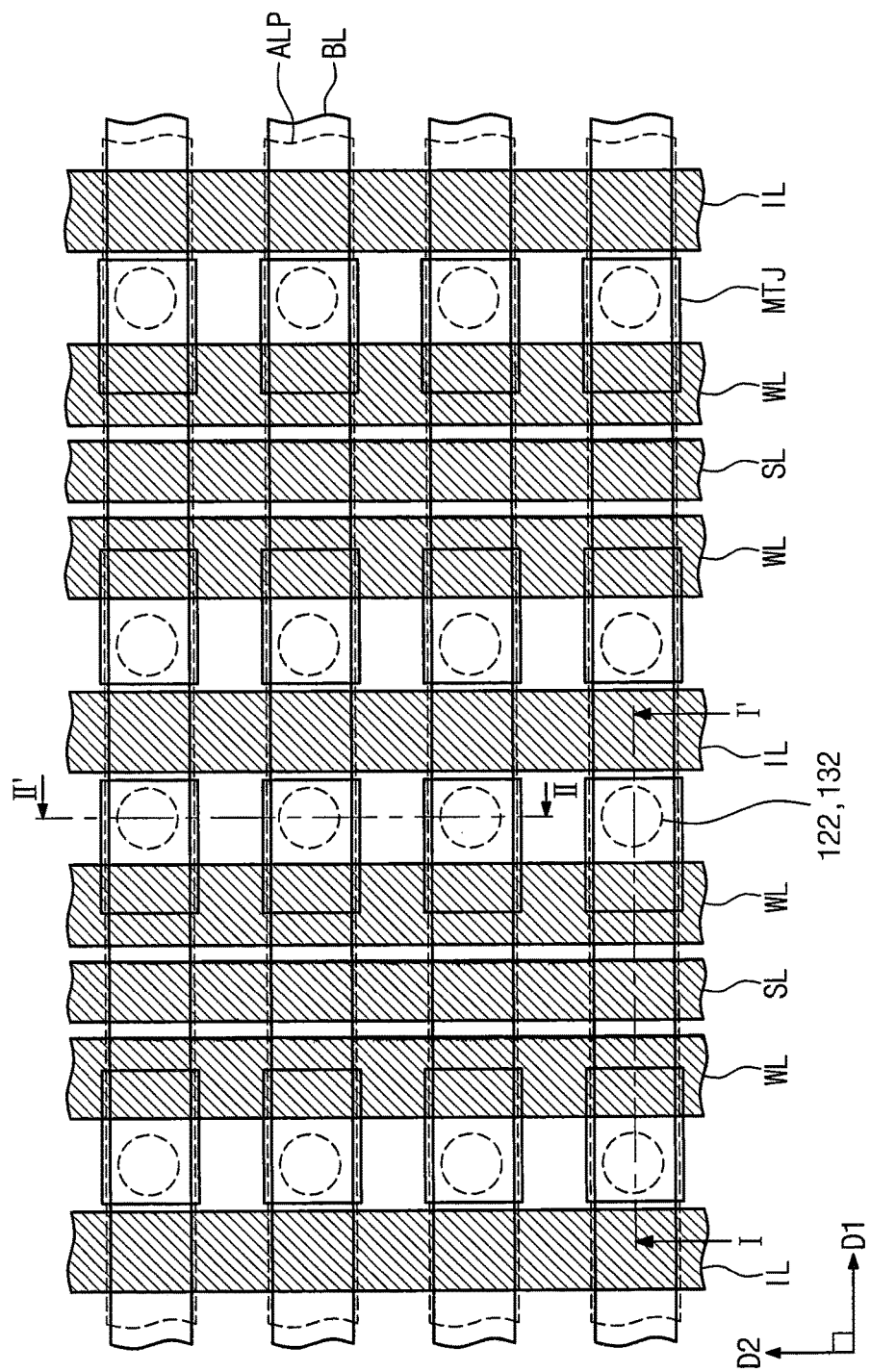
FIG. 8 is a plan view illustrating a magnetic memory device according to example embodiments of the inventive concept.
Figure 9:
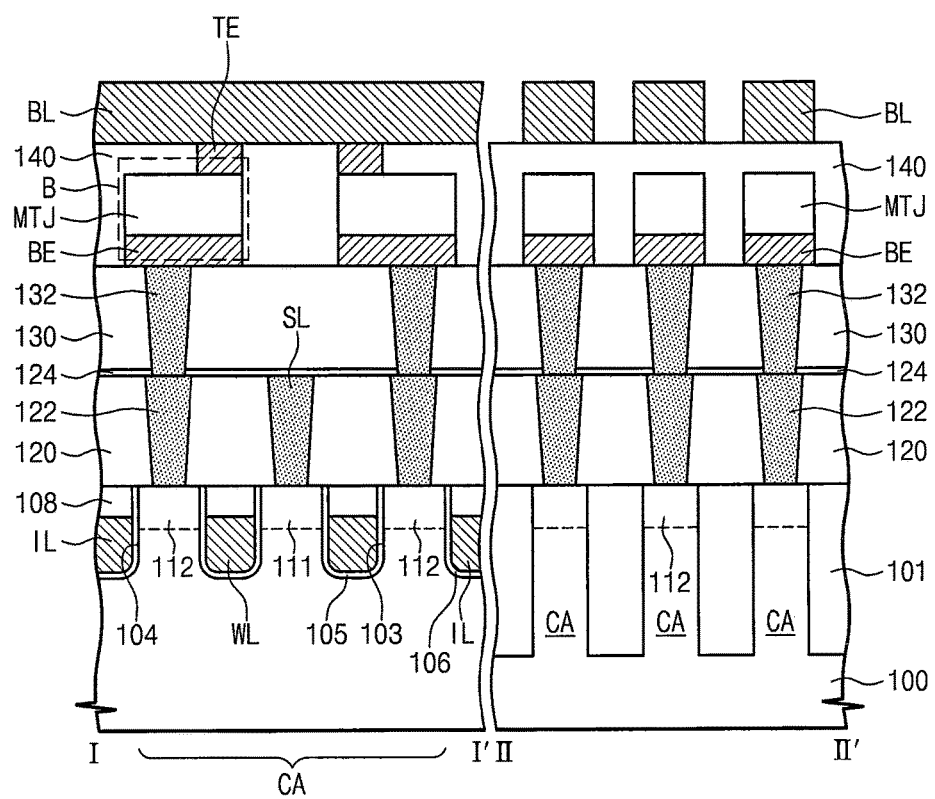
FIG. 9 is a sectional view taken along lines I-I' and II-II' of FIG. 8.

FIG. 8 is a plan view illustrating a magnetic memory device according to example embodiments of the inventive concept, and FIG. 9 is a sectional view taken along lines I-I' and II-II' of FIG. 8. A portion A of FIG. 4 corresponds to an enlarged view of a portion B of FIG. 9.

Referring to FIGS. 8 and 9, a substrate 100 may be provided. The substrate 100 may be a silicon substrate, germanium substrate, a silicon on insulator (SOI) substrate, and/or a silicon-germanium substrate. The substrate 100 may have the first conductivity type. Device isolation patterns 101 may be formed on the substrate 100. The device isolation patterns 101 may define active line patterns ALP. As shown in FIG. 8, when viewed in a plan view, each of the active line patterns ALP may be a line-shaped pattern extending parallel to a first direction D1. The device isolation patterns 101 and the active line patterns ALP may be alternatingly arranged in a second direction D2 that is perpendicular to the first direction D1. In certain embodiments, the active line patterns ALP may be doped to have the first conductivity type.

The substrate 100 may include isolation recess regions 104 that are provided to cross the active line patterns ALP and the device isolation patterns 101. When viewed in a plan view, each of the isolation recess regions 104 may be shaped like a groove and may extend parallel to the second direction D2. The isolation recess regions 104 may be provided in such a way that each of the active line patterns ALP is sectioned into a plurality of active patterns CA. Each of the active patterns CA may be a portion of the active line pattern ALP positioned between an adjacent pair of the isolation recess regions 104. In other words, each of the active patterns CA may be defined by an adjacent pair of the device isolation patterns 101 and an adjacent pair of the isolation recess regions 104. When viewed in a plan view, the active patterns CA may be disposed spaced apart from each other in both of the first and second directions to form a matrix-shaped arrangement.

Gate recess regions 103 may be formed to cross the active patterns CA arranged along the second direction D2. Each of the gate recess regions 103 may be shaped like a groove and may extend parallel to the isolation recess regions 104. In example embodiments, a pair of the gate recess regions 103 may cross each of the active patterns CA. In this case, a pair of cell transistors may be formed on each of the active patterns CA.

The gate recess regions 103 may have substantially the same depth as the isolation recess regions 104. A width of each of the gate recess regions 103 may be substantially equal to or different from that of the isolation recess regions 104. The depth of the gate and isolation recess regions 103 and 104 may be smaller than depths of the device isolation patterns 101.

[Word lines WL may be provided in the gate recess regions 103, respectively. A gate dielectric layer 105 may be provided between the word line WL and the gate recess region 103. Due to the shape of the gate recess region 103, the word line WL may be a line-shaped structure extending parallel to the second direction D2. Each cell transistor may include the word line WL and a channel region, which has a recessed profile and faces the word line WL.

Isolation lines IL may be provided in the isolation recess regions 104, respectively. An isolation gate dielectric layer 106 may be provided between the isolation line IL and the isolation recess region 104. The isolation line IL may be a line-shaped structure extending parallel to the second direction D2.

A gate mask pattern 108 may be provided on each of the word and isolation lines WL and IL. The word and isolation lines WL and IL may have top surfaces lower than the top entrances of the cell and isolation recess regions 103 and 104. The gate mask pattern 108 may be provided in an upper portion of each of the cell and isolation recess regions 103 and 104. The gate mask pattern 108 may have a top surface that is substantially coplanar with that of the substrate 100.

In operation of the magnetic memory device, an isolation voltage may be applied to the isolation lines IL. The isolation voltage may be selected to prevent a channel or inversion layer from being formed below the isolation recess regions 104. In other words, when the isolation lines IL are applied with the isolation voltage, isolation channel regions positioned below the isolation lines IL may be turned-off. Accordingly, the active patterns CA of each active line pattern ALP may be electrically separated from each other. For example, in the case where the active line patterns ALP are doped with p-type dopants, the isolation voltage may be a ground or negative voltage.

For example, the word line WL may be formed of or include at least one of doped semiconductor materials (e.g., doped silicon and so forth), metals (e.g., tungsten, aluminum, titanium, or tantalum), conductive metal nitrides (e.g., titanium nitride, tantalum nitride, or tungsten nitride), or metal-semiconductor compounds (e.g., metal silicide). In example embodiments, the isolation line IL may be formed of the same material as the word line WL. The cell and isolation gate dielectric layers 105 and 106 may be formed of or include, for example, silicon oxide, silicon nitride, silicon oxynitride, and/or high-k dielectric materials including insulating metal oxides (e.g., hafnium oxide or aluminum oxide). The gate mask pattern 108 may include, for example, silicon oxide, silicon nitride, and/or silicon oxynitride.

A first doped region 111 may be provided in each of the active patterns CA and between each adjacent pair of the word lines WL. Second doped regions 112 may be provided in the active patterns CA and between the word and isolation lines WL and IL. In example embodiments, the first doped region 111 may be provided in a central region of each of the active patterns CA, and a pair of the second doped regions 112 may be respectively provided in edge regions of each of the active patterns CA. Accordingly, the pair of cell transistors formed on each active pattern CA may share the first doped region 111. The first and second doped regions 111 and 112 may serve as source and drain regions of the cell transistor. The first and second doped regions 111 and 112 may be doped to have a second conductivity type different from the first conductivity type. One of the first and second conductivity types may be an n-type, and the other may be a p-type.

Further, a first interlayered insulating layer 120 may be provided on the substrate 100. The first interlayered insulating layer 120 may be formed of or include, for example, silicon oxide. The first interlayered insulating layer 120 may be formed to have source grooves, and source lines SL may be provided to fill the source grooves, respectively. The source lines SL may extend parallel to the second direction D2. Each source line SL may be formed of or include at least one of doped semiconductor materials (e.g., doped silicon and so forth), metals (e.g., tungsten, aluminum, titanium, or tantalum), conductive metal nitrides (e.g., titanium nitride, tantalum nitride, or tungsten nitride), or metal-semiconductor compounds (e.g., metal silicide). Each source line SL may connect the first doped regions 111, which are arranged in the second direction D2, to each other. Further, the first interlayered insulating layer 120 may be formed to have first contact holes, and first contact plugs 122 may be respectively provided in the first contact holes and may be respectively connected to the second doped regions 112. The first contact plugs 122 may be formed of the same conductive material as the source lines SL. The source lines SL and the first contact plugs 122 may have top surfaces that are substantially coplanar with that of the first interlayered insulating layer 120.

An etch stop layer 124 may be provided on the first interlayered insulating layer 120. The etch stop layer 124 may be formed to cover the top surfaces of the source lines SL. The etch stop layer 124 may be formed of an insulating material having an etch selectivity with respect to the first interlayered insulating layer 120. For example, the first interlayered insulating layer 120 may be formed of silicon oxide, and the etch stop layer 124 may be formed of silicon nitride and/or silicon oxynitride.

The second interlayered insulating layer 130 may be provided on the etch stop layer 124. The second interlayered insulating layer 130 may be formed of silicon oxide.

Second contact plugs 132 may be provided to penetrate both of the second interlayered insulating layer 130 and the etch stop layer 124. The second contact plugs 132 may be electrically connected to the second doped regions 112, respectively, via the first contact plugs 122. In example embodiments, ohmic patterns may be provided between the first and second contact plugs 122 and 132, between the first contact plugs 122 and the second doped regions 112, and between the source lines SL and the first doped regions 111. The ohmic pattern may be formed of or include at least one of metal-semiconductor compounds including a metal silicide (e.g., cobalt silicide or titanium silicide).

A plurality of memory elements ME may be provided on the second interlayered insulating layer 130. Each of the memory elements ME may include the lower electrode BE, the magnetic tunnel junction MTJ, and the capping electrode TE. As an example, the magnetic tunnel junction MTJ may be configured to have the same structure as that of FIG. 4.

As an example, each of the memory elements ME may be patterned to have an island-shaped structure. When viewed in a plan view, the memory elements ME may be overlapped with the second contact plugs 132, respectively. The capping electrode TE and the second contact plug 132 may be offset from a center of the magnetic tunnel junction MTJ in opposite directions. For example, the capping electrode TE and the second contact plug 132 may be asymmetrically arranged spaced apart from each other, when viewed in a plan view.

A third interlayered insulating layer 140 may be formed on the second interlayered insulating layer 130 to be in contact with sidewalls of the memory elements ME. The third interlayered insulating layer 140 may be formed to expose the top surfaces of the memory elements ME.

The bit lines BL may be provided on the third interlayered insulating layer 140. The bit lines BL may extend in the first direction D1. Each of the bit lines BL may be in common contact with a plurality of the memory elements ME arranged in the first direction D1. For example, the bit line BL may be connected to the memory elements ME without any contact plug interposed therebetween. This makes it possible to simplify the fabrication process and reduce contact resistance between the bit line BL and the memory elements ME. Further, it is possible to improve uniformity in contact resistance between the bit line BL and the memory elements ME.

FIGS. 10 through 13 are sectional views taken along directions corresponding to the lines I-I' and II-II' of FIG. 8 to illustrate a method of fabricating a magnetic memory device according to example embodiments of the inventive concept.

Figure 10:
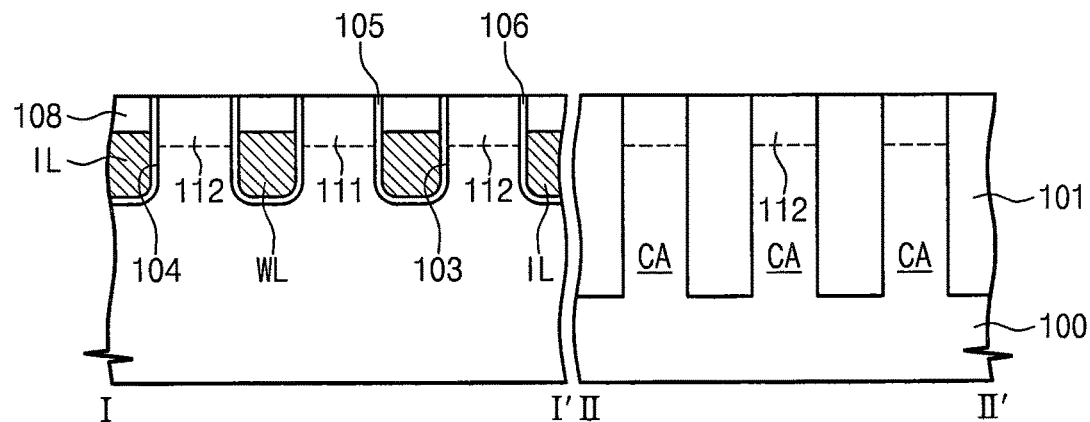
FIGS. 10 through 13 are sectional views taken along directions corresponding to the lines I-I' and II-II' of FIG. 8 to illustrate a method of fabricating a magnetic memory device according to example embodiments of the inventive concept.

Referring to FIGS. 8 and 10, the substrate 100 may be prepared. The substrate 100 may be a silicon substrate, a germanium substrate, a silicon on insulator (SOI) substrate, and/or a silicon-germanium substrate. The substrate 100 may have the first conductivity type.

The device isolation patterns 101 may be formed on the substrate 100 to define the active line patterns ALP. The active line patterns ALP may be formed to be parallel to the first direction D1 of FIG. 8. The device isolation patterns 101 may be formed using a shallow trench isolation (STI) process.

The active line patterns ALP and the device isolation patterns 101 may be patterned to form the gate and isolation recess regions 103 and 104 extending parallel to the second direction D2 of FIG. 8. The isolation recess regions 104 may be formed to section each active line pattern ALP into a plurality of active patterns CA. The gate recess regions 103 may cross the cell active patterns CA. The gate and isolation recess regions 103 and 104 may be formed to have depths that are smaller than those of the device isolation patterns 101.

The cell gate dielectric layer 105 may be formed to conformally cover an inner surface of each gate recess region 103. The isolation gate dielectric layer 106 may also be formed to conformally cover an inner surface of each isolation recess region 104. In example embodiments, the cell and isolation gate dielectric layers 105 and 106 may be simultaneously formed using the same process. The cell and isolation gate dielectric layers 105 and 106 may be silicon oxide layers, which are formed by performing a thermal oxidation process on the substrate 100. Alternatively, the cell and isolation gate dielectric layers 105 and 106 may be formed of or include at least one of silicon oxide, silicon nitride, silicon oxynitride, or high-k dielectric materials including insulating metal oxides (e.g., hafnium oxide or aluminum oxide).

Next, a first conductive layer may be formed to fill the gate and isolation recess regions 103 and 104. The first conductive layer may be formed of or include at least one of doped semiconductor materials (e.g., doped silicon and so forth), metals (e.g., tungsten, aluminum, titanium, or tantalum), conductive metal nitrides (e.g., titanium nitride, tantalum nitride, or tungsten nitride), or metal-semiconductor compounds (e.g., metal silicide). The first conductive layer may be etched to form the word line WL in each gate recess region 103 and the isolation line IL in each isolation recess region 104. The word and isolation lines WL and IL may be recessed to have top surfaces that are lower than that of the substrate 100.

The gate mask patterns 108 may be formed on the word and isolation lines WL and IL to fill the gate and isolation recess regions 103 and 104 provided with the word and isolation lines WL and IL. The gate mask pattern 108 may be formed of or include at least one of silicon oxide, silicon nitride, or silicon oxynitride.

Dopants may be injected into the cell active patterns CA between or at both sides of the word lines WL to form the first and second doped regions 111 and 112 of the second conductivity type. Bottom surfaces of the first and second doped regions 111 and 112 may be formed at a level higher than bottom levels of the word and isolation lines WL and IL.

Figure 11:
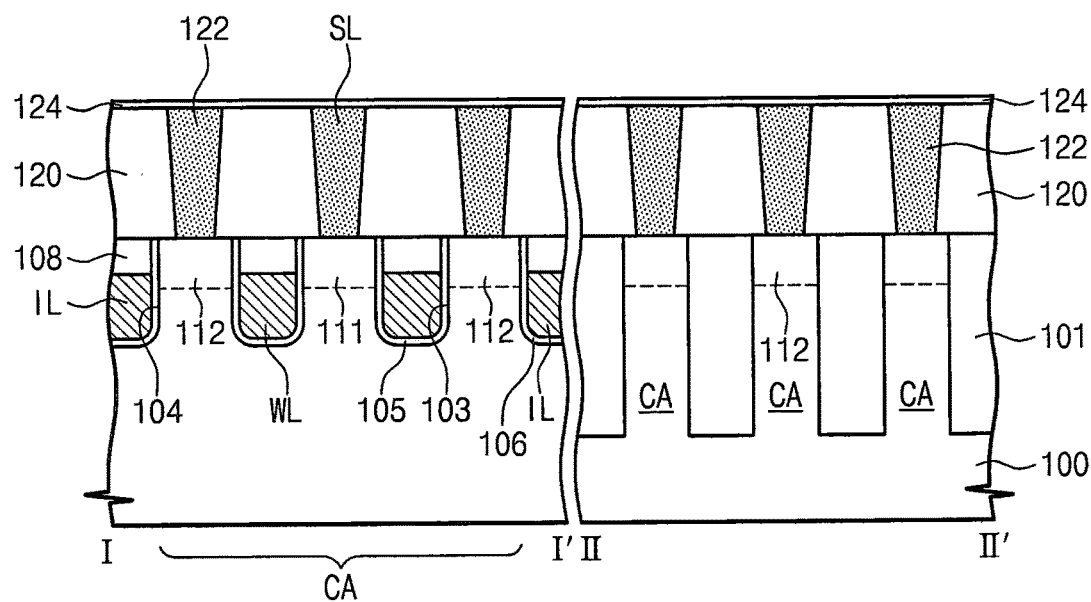

Referring to FIGS. 8 and 11, the first interlayered insulating layer 120 may be formed on the substrate 100. The first interlayered insulating layer 120 may be formed of silicon oxide. The first interlayered insulating layer 120 may be patterned to form cell holes and source grooves.

A second conductive layer may be formed to fill the cell holes and the source grooves. The second conductive layer may be formed of or include at least one of doped semiconductor materials (e.g., doped silicon and so forth), metals (e.g., tungsten, aluminum, titanium, or tantalum), conductive metal nitrides (e.g., titanium nitride, tantalum nitride, or tungsten nitride), or metal-semiconductor compounds (e.g., metal silicide). A planarization process may be performed on the second conductive layer to expose the second interlayered insulating layer 120, and thus, the first contact plugs 122 may be respectively formed in the cell holes and the source lines SL may be respectively formed in the source grooves. The first contact plugs 122 may be respectively connected to the second doped regions 112, and the source lines SL may be respectively connected to the first doped regions 111. In example embodiments, the ohmic patterns may be formed between the source lines SL and the first doped regions 111 and between the first contact plugs 122 and the second doped regions 112. The ohmic pattern may be formed of or include at least one of metal-semiconductor compounds including a metal silicide (e.g., cobalt silicide or titanium silicide).

Thereafter, the capping insulating layer 124 may be formed on the first interlayered insulating layer 120, the first contact plugs 122, and the source lines SL. The capping insulating layer 124 may be formed of or include silicon nitride and/or silicon oxynitride.

Figure 12:
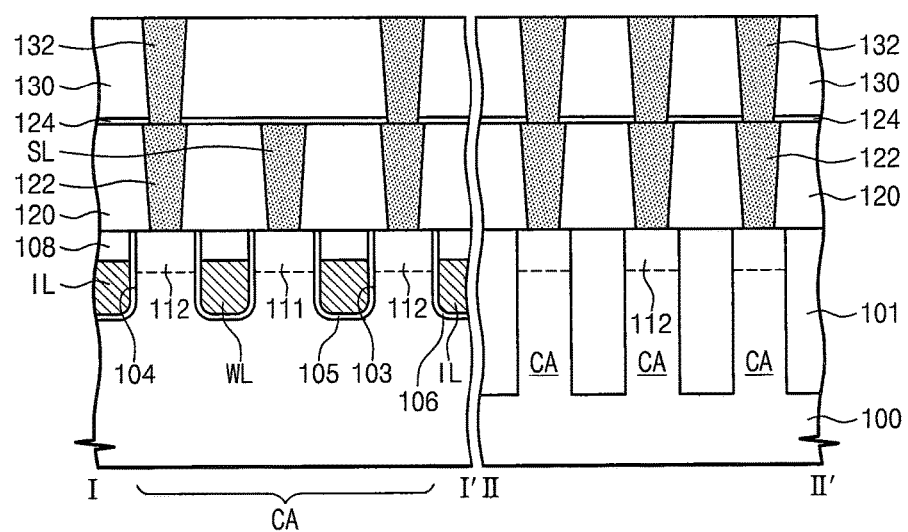

Referring to FIGS. 8 and 12, the second interlayered insulating layer 130 may be formed on the capping insulating layer 124. The second interlayered insulating layer 130 may be formed of silicon oxide. The second contact plugs 132 may be formed to penetrate both of the second interlayered insulating layer 130 and the capping insulating layer 124. The second contact plugs 132 may be formed by the same method as and of the same material as the first contact plugs 122. The second contact plugs 132 may be electrically and respectively connected to the second doped regions 112 through the first contact plugs 122. In example embodiments, the ohmic pattern may be formed between the second contact plugs 132 and the first contact plugs 122. The ohmic pattern may be formed of or include at least one of metal-semiconductor compounds including a metal silicide (e.g., cobalt silicide or titanium silicide).

Figure 13:
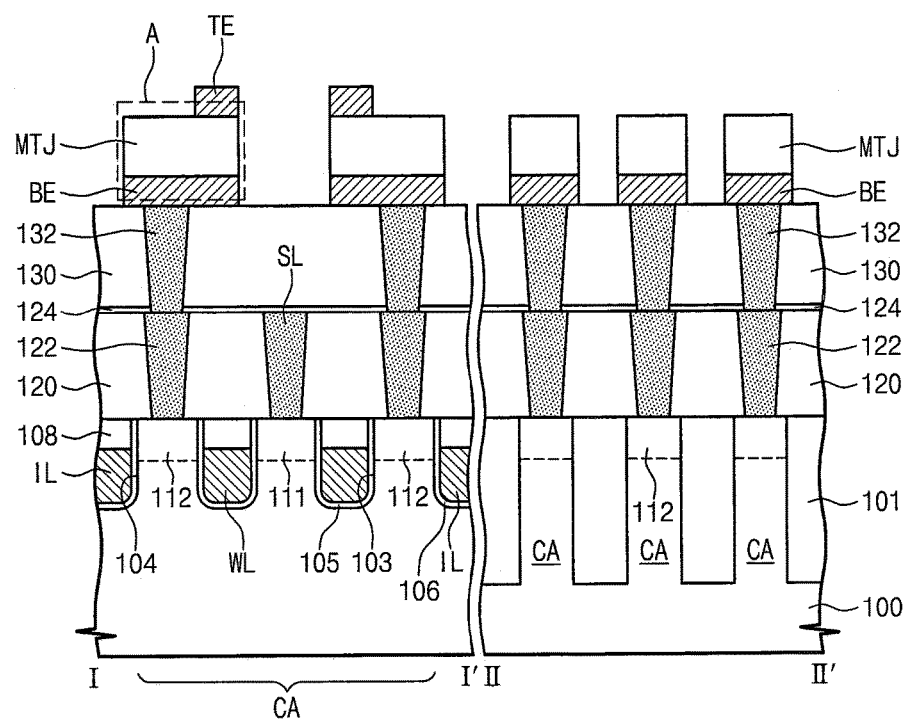

Referring to FIGS. 8 and 13, a plurality of memory elements ME may be formed on the second interlayered insulating layer 130. Each of the memory elements ME may include the lower electrode BE, the magnetic tunnel junction MTJ, and the capping electrode TE. For example, each of the memory elements ME may be formed using the method described with reference to FIGS. 7A through 7E. As an example, each of the memory elements ME may be patterned to have an island-shaped structure. When viewed in a plan view, the memory elements ME may be overlapped with the second contact plugs 132, respectively.

Referring back to FIGS. 8 and 9, the third interlayered insulating layer 140 may be formed on the second interlayered insulating layer 130 to be in contact with the sidewalls of the memory elements ME. The third interlayered insulating layer 140 may be formed to expose the top surfaces of the capping electrodes TE.

The bit lines BL may be provided on the third interlayered insulating layer 140. The bit lines BL may extend in the first direction D1. Each of the bit lines BL may be connected in common to a plurality of the memory elements ME arranged along the first direction D1.

Figure 14:
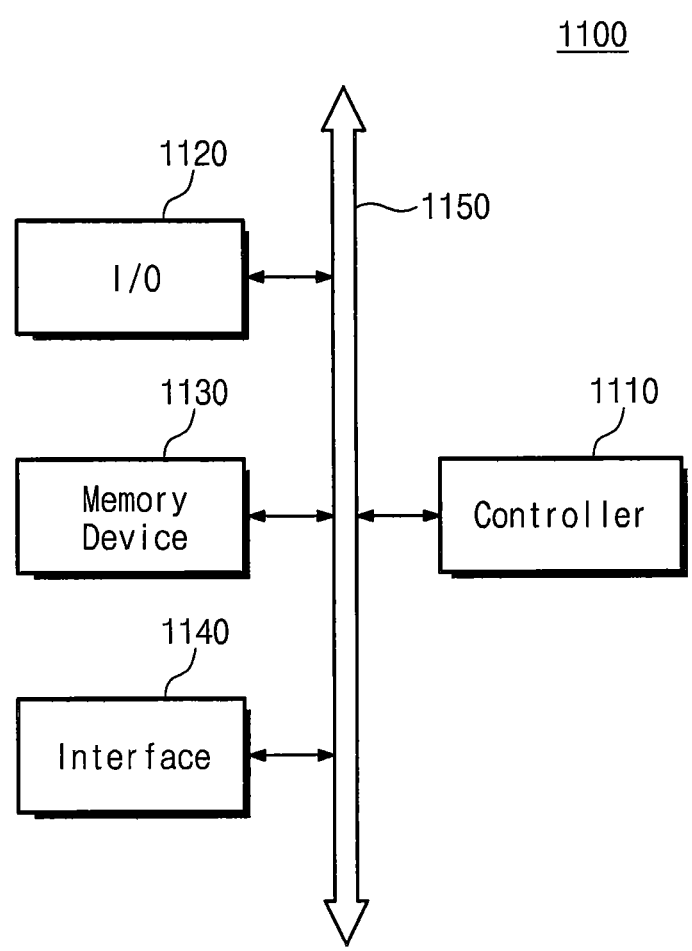
FIG. 14 is a block diagram illustrating an example of electronic systems including a magnetic memory device according to example embodiments of the inventive concept.

FIG. 14 is a block diagram illustrating an example of electronic systems including a magnetic memory device according to example embodiments of the inventive concept.

Referring to FIG. 14, an electronic system 1100 according to example embodiments of the inventive concept may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which data (e.g., electrical signals) are transmitted. The memory device 1130 may include at least one of the magnetic memory devices according to embodiments of the inventive concept.

The controller 1110 may include at least one of a microprocessor, a digital signal processor, a microcontroller, or other logic devices having a similar function to any one thereof. The I/O unit 1120 may include a keypad, a keyboard and/or a display unit. The memory device 1130 may store data and/or commands. The interface unit 1140 may transmit data to a communication network or may receive data from a communication network. The interface unit 1140 may operate in wired or wireless mode. For example, the interface unit 1140 may include an antenna for the wireless-mode operation or a transceiver for the wired-mode operation. The electronic system 1100 may further include a fast dynamic random access memory (DRAM) device and/or a fast static random access memory (SRAM) device which acts as a working memory for improving an operation of the controller 1110.

The electronic system 1100 may be applied to a personal digital assistant (PDA), a portable computer, a web tablet, a wireless phone, a mobile phone, a digital music player, a memory card, or other electronic products receiving and/or transmitting information data by wireless.

Figure 15:
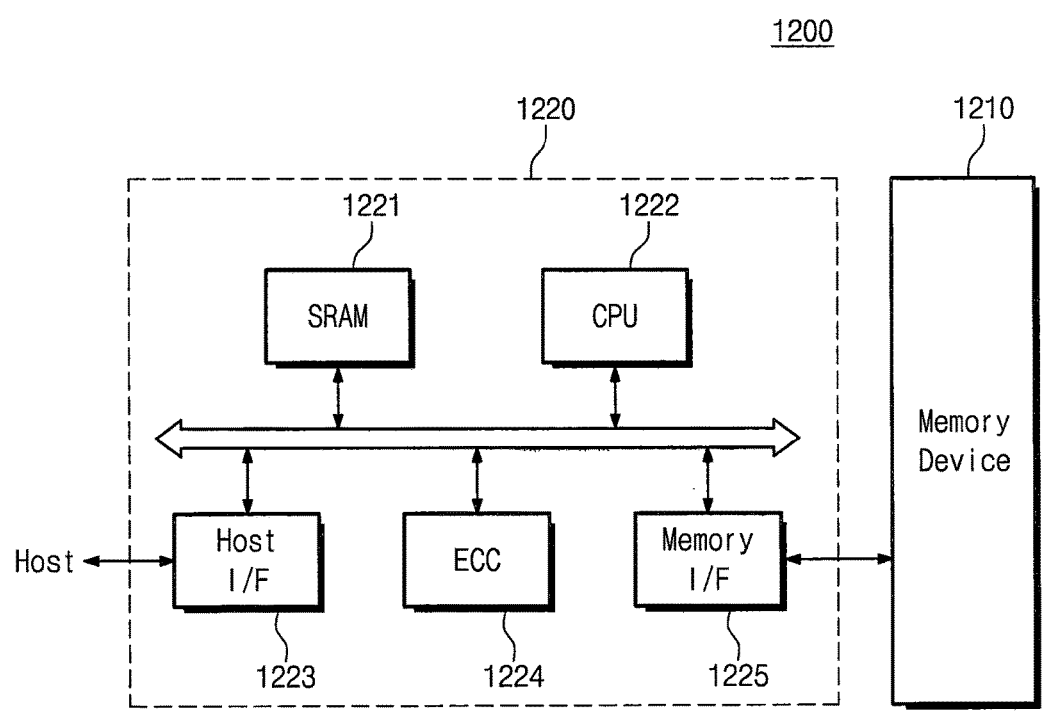
FIG. 15 is a block diagram illustrating an example of memory cards including a magnetic memory device according to example embodiments of the inventive concept.

FIG. 15 is a block diagram illustrating an example of memory cards including a magnetic memory device according to example embodiments of the inventive concept.

Referring to FIG. 15, a memory card 1200 may include a memory device 1210. The memory device 1210 may include at least one of the magnetic memory devices according to embodiments of the inventive concept. In some embodiments, the memory device 1210 may further include a memory device, which is of a different type from the memory devices according to embodiments of the inventive concept. For example, the memory device 1210 may further include a dynamic random access memory (DRAM) device and/or a static random access memory (SRAM) device. The memory card 1200 may include a memory controller 1220 that controls data communication between a host and the memory device 1210.

The memory controller 1220 may include a central processing unit 1222 that controls overall operations of the memory card 1200. In addition, the memory controller 1220 may include an SRAM device 1221 serving as an operational memory of the central processing unit 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors in data read from the memory device 1210. The memory card 1200 may further include a read only memory (ROM) device that stores code data to interface with the host. The memory card 1200 may be used as a portable data storage card. Alternatively, the memory card 1200 may be provided in the form of a solid state drive (SSD).

Figure 16:
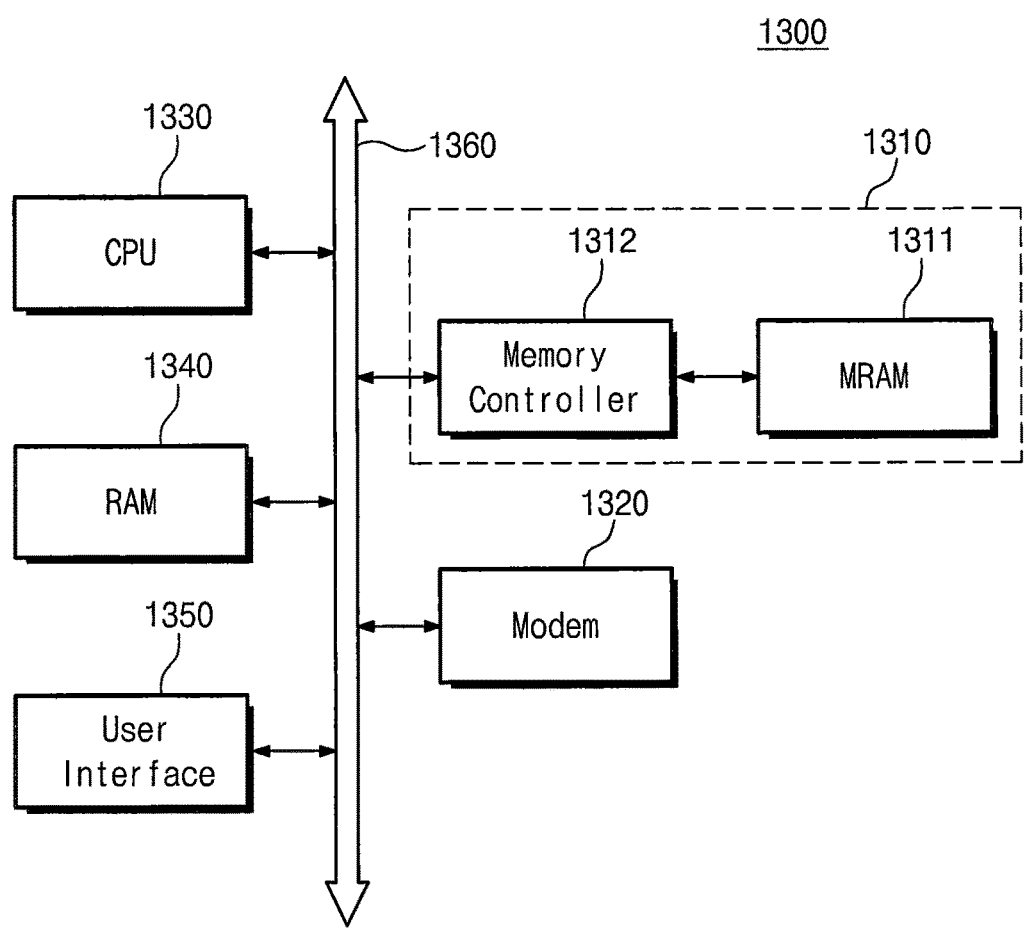
FIG. 16 is a block diagram illustrating an example of information processing systems including a magnetic memory device according to example embodiments of the inventive concept.

FIG. 16 is a block diagram illustrating an example of information processing systems including a magnetic memory device according to example embodiments of the inventive concept.

Referring to FIG. 16, an information processing system 1300 may be provided in the form of a mobile device or a desk top computer and may include a memory system 1310 including at least one of the magnetic memory devices according to example embodiments of the inventive concept. The information processing system 1300 also includes a modem 1320, a central processing unit (CPU) 1330, a RAM 1340, and a user interface 1350, which may be electrically connected to the memory system 1310 via a system bus 1360. The memory system 1310 may include an MRAM device 1311 and a memory controller 1312 controlling an overall operation of the MRAM device 1311. Data processed by the CPU 1330 and/or input from the outside may be stored in the memory system 1310. Here, the memory system 1310 may constitute a solid state drive SSD, and in this case, the information processing system 1300 may be able to store reliably a large amount of data in the memory system 1310. It will be apparent to those of ordinary skill in the art that the information processing system 1300 may be also configured to include an application chipset, a camera image processor (CIS), and/or an input/output device.

According to example embodiments of the inventive concept, a magnetic memory device may include a perpendicularly magnetized magnetic tunnel junction whose magnetization direction can be switched by a small current density (Jc).

While example embodiments of the inventive concepts have been particularly shown and described, it will be understood by one of ordinary skill in the art that variations in form and detail may be made therein without departing from the spirit and scope of the attached claims.

What is claimed is:

1. A magnetic memory device, comprising:
   a lower electrode;
   a magnetic tunnel junction on the lower electrode; and
   a capping electrode on the magnetic tunnel junction,
   wherein the magnetic tunnel junction comprises:
   a reference magnetic pattern having a fixed magnetization direction;
   a free magnetic pattern having a switchable magnetization direction;
   a tunnel barrier pattern between the reference magnetic pattern and the free magnetic pattern;
   a sub oxide pattern on the free magnetic pattern; and
   a metal pattern between the sub oxide pattern and the free magnetic pattern,
   the fixed and switchable magnetization directions are substantially perpendicular to top surfaces of the reference and free magnetic patterns defining the magnetic tunnel junction, and
   the capping electrode is asymmetrically centered at a position that is offset from a center of the magnetic tunnel junction defined by an axis passing through upper and lower surfaces of the magnetic tunnel junction.

2. The device of claim 1, wherein the metal pattern comprises at least one of a transition metal and a rare-earth metal.

3. The device of claim 1, wherein the metal pattern has a thickness ranging from about 0.5 to about 2 nm.

4. The device of claim 1, wherein the capping electrode is disposed to expose at least a portion of an upper surface of the sub oxide pattern.

5. The device of claim 1, wherein the magnetic tunnel junction has first and second maximum widths, respectively, measured in first and second directions parallel to the top surfaces of the reference and free magnetic patterns, and the first and second directions are perpendicular to each other, and the first maximum width is greater than the second maximum width.

6. The device of claim 5, wherein the capping electrode is disposed at an edge of the magnetic tunnel junction in the first direction.

7. The device of claim 5, wherein the capping electrode has a width that is less than the second maximum width.

* * * * *